United States Patent Office 3,053,699

Patented Sept. 11, 1962

3,053,699
DIP COATING PROCESS

Ralph D. Irons, Cicero, and Edgar W. Weeks, Jr., Oak Park, Ill., assignors to Western Electric Company, Incorporated, New York, N.Y., a corporation of New York No Drawing. Filed Mar. 25, 1960, Ser. No. 17,461
3 Claims. (Cl. 117—212)

This invention relates to methods of dip coating a base metal having a porous surface with a dissimilar metal, and more particularly to the utilization of such methods for the dip soldering of printed circuit boards having porous conductors such as copper or silver on ceramic-bases.

In the production of ceramic base printed wiring boards, it is known to apply the metal conductors in paste form, such as a paste of copper or silver together with an organic vehicle such as linseed oil, cottonseed oil or soya bean oil, and comminuted glass, mica or porcelain. It is also common to use a decalcomania or screen during the application of the metallic-paste to the board in order to maintain the desired spacing between the respective conductors and to insure uniformity of conductivity of each conductor.

The applied metallic-paste then is normally fired (while the paste is wet or dry) in an oxidizing atmosphere such as air or oxygen at about 800°–1500° to burn out the organic vehicle and subsequently heated in a reducing atmosphere such as hydrogen at about 1600° to 1900° F. to bond the metal in the paste to the ceramic base. This type of process is described in detail in a copending application of R. O. Rada—A. W. Treptow, serial No. 679,859, filed on August 23, 1957. Finally, the metal conductors, thus formed on the ceramic base, are fluxed, preferably with an alcohol-rosin solution and solder-coated by dipping the wiring board into a molten solder, preferably of tin and lead, so as to protect the surface of the conductors and to facilitate subsequent solder connections thereto.

In practice, it has been found that the conductors of the resulting printed wiring boards, produced as set forth above, often contain interstices, depressions, bubbles and other irregularities which greatly impair the efficacy of the solder coating operation. This difficulty arises because of the relatively high surface tension of conventional solders which precludes them from wetting interstices present on the surface of the conductors and often results in a poor bond between the solder and the conductors.

This problem has been aggravated by the fact that the printed wiring board may only be immersed in the molten solder for a relatively short period of time because of the tendency of the metal conductors to dissolve in the molten solder.

It is, therefore, an object of this invention to provide an improved method of dip coating a base metal having a porous surface with a dissimilar metal.

Another object of the present invention is to provide a method for minimizing interstices and irregularities in the surfaces of the metallic conductors while the conductors are still in paste-form and prior to firing.

A further object of the invention is to provide a method for causing molten solder to become violently agitated, locally with respect to any interstices in the surfaces of the metallic conductors, whereby the molten solder is forced into such interstices.

Still another object of the instant invention is to provide a method for minimizing irregularities in the surfaces of the metallic conductors wherein the ceramic base containing the conductors is vibrated while the metallic conductors are still in paste form.

A still further object of the invention is to provide a method for causing molten solder to enter interstices in the surfaces of electric conductors wherein the conductors, prior to immersion in the molten solder, are wetted with water, which vaporizes below the soldering temperature. By this procedure, the flashing off of the water in the interstices of the conductors, as the conductors are immersed in the hot molten solder, locally agitates the molten solder violently, thereby forcing solder into the interstices.

With these and other objects in mind, the present invention contemplates an improved method for the application of metallic conductors in paste form, particularly pastes of a major proportion of copper and a minor proportion of a combination of glass and an organic vehicle such as linseed oil, to a ceramic base such as porcelain or the vitreous material known as steatite. In practicing the present invention, the paste preferably comprises about 5 to 15 parts by weight of copper, about 0.5 to 2.0 parts by weight of comminuted glass and about 0.5 to 3.0 parts by weight of linseed oil or other vehicle such as Dupont Squeegee—medium X-606 (e.g. 10 copper—1 glass—1 linseed oil), the ceramic base being vibrated, preferably just after the paste has been applied, in order to minimize interstices and other irregularities.

Vibration is generally for about 0.5 second to 5.0 minutes (e.g. 30 seconds) advantageously using a 10 to 1,000 (e.g. 120) cycle per second vibrator, such as a Vibra-Tool vibrator. It has been found that the intensity of the vibrator as just mentioned is sufficient to eliminate a substantial proportion of the interstices and other irregularities present in the surface of the paste.

When practicing the instant invention, it is preferred that the vibration be just sufficient in intensity to smooth out interstices and other irregularities in the surface of the paste. However, it is within the purview of the present invention to employ even more intense vibrations, as long as they are insufficient to deform or otherwise substantially alter the pattern of the printed circuit-paste. Also, although it is preferred to agitate the metallic paste just after it has been applied, the instant invention contemplates such agitation at any time prior to the drying of the paste to an extent that the surface thereof is no longer substantially deformable upon agitation.

In the preferred embodiment of the invention, after the metallic paste (e.g. copper—glass—organic vehicle) is applied to the ceramic base, optionally dried, air-fired at about 1000°–1300° F. (e.g. 1150° F.) until the organic vehicle ceases to burn, and heated in a reducing atmosphere such as hydrogen at about 1700°–1850° F. (e.g. 1780° F.) for about 0.01 to 10.0 minutes (e.g. 2.0 minutes), the metallic paste is then in the form of a metallic conductor (or conductors) bonded to the ceramic base. In accordance with the present invention, prior to fluxing the conductor for about 0.5 to 2.0 seconds (e.g. for 1 second with a rosin-ethyl alcohol flux solution) and then immersing the conductor in a molten solder (e.g. a 60–40 tin-lead solder) at about 300°–600° F. (e.g. 500° F.) for about 0.1 to 20.0 seconds (e.g. 1.8 seconds), each conductor is thoroughly wetted (e.g. for 1 to 10 seconds) by dipping in or spraying with a low boiling liquid (preferably water) which vaporizes on subsequent contact with the molten solder. This vaporization causes the solder adjacent any interstices in the surfaces of the conductors to become violently agitated, thereby forcing solder into the interstices, as the wet conductors are being lowered into the molten solder, which more efficiently solder-coats such conductors.

It is to be understood that the above-described arrangements are simply illustrative of the application of the principles of the invention. Numerous other arrangements, modifications and variations may be readily devised by those skilled in the art, which will embody the principles of the invention and thus fall within the spirit and scope thereof.

What is claimed is:

1. In a process of dip coating a base metal having a porous surface with a dissimilar metal having a melting point which is lower than that of the base metal and which is above about 300° F., the coating process including the steps of applying a nonaqueous flux to the surface of the base metal and immediately thereafter dipping the base metal in a molten bath of the coating metal; the improvement which compirses the additional step of wetting the exposed surfaces of the porous base metal with water immediately prior to the flux-applying step, whereby the water wets the porous surface thoroughly and vaporizes during the dip coating step so as to provide for a more uniform and adherent coating.

2. The process as recited in claim 1, wherein the base metal comprises porous metallic conductors of a printed circuit board adhered to an insulating base, and wherein the coating metal is molten solder.

3. The process as recited in claim 2, wherein the nonaqueous flux is a rosin-alcohol solution, and the solder is a tin-lead solder.

References Cited in the file of this patent

UNITED STATES PATENTS

| | | |
|---|---|---|
| 519,968 | Quinby | May 15, 1894 |
| 2,321,071 | Ehrhart et al. | June 8, 1943 |
| 2,326,372 | Lignian | Aug. 10, 1943 |
| 2,491,284 | Sears | Dec. 13, 1949 |
| 2,771,663 | Henry | Nov. 27, 1956 |